(12) United States Patent
Kim et al.

(10) Patent No.: US 10,866,032 B2
(45) Date of Patent: Dec. 15, 2020

(54) POLYMER-BASED PULSATING HEAT PIPE AND MANUFACTURING METHOD THEREOF

(71) Applicant: Korea Advanced Institute of Science and Technology, Dejeon (KR)

(72) Inventors: Sung Jin Kim, Dejeon (KR); Jonghyun Lim, Dejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/912,776

(22) Filed: Mar. 6, 2018

(65) Prior Publication Data
US 2018/0299206 A1 Oct. 18, 2018

(30) Foreign Application Priority Data
Mar. 6, 2017 (KR) .......................... 10-2017-0028331

(51) Int. Cl.
*F28D 15/00* (2006.01)
*F28D 15/02* (2006.01)
(Continued)

(52) U.S. Cl.
CPC .......... *F28D 15/0241* (2013.01); *B23P 15/26* (2013.01); *B32B 3/26* (2013.01);
(Continued)

(58) Field of Classification Search
CPC ............... F28D 15/0241; F28D 15/025; F28D 15/0283; F28F 21/06; F28F 21/089; F28F 2230/00; F28F 2245/00; F28F 2265/16; H01L 23/427; H01L 23/3737; H05K 7/20336; B32B 27/32; B32B 3/26; B32B 37/0076
See application file for complete search history.

(56) References Cited

U.S. PATENT DOCUMENTS

2009/0101308 A1* 4/2009 Hardesty ............. F28D 15/0233
165/80.4

FOREIGN PATENT DOCUMENTS

KR 10-1508126 4/2015

OTHER PUBLICATIONS

2016 Annual Conference of the Korean Society of Mechanical Engineers, Conference Schedule and Information.
(Continued)

*Primary Examiner* — Henry T Crenshaw
*Assistant Examiner* — Kamran Tavakoldavani
(74) *Attorney, Agent, or Firm* — Norton Rose Fulbright US LLP; James R. Crawford

(57) ABSTRACT

Provided is a polymer-based pulsating heat pipe that has high flexibility and is applicable to a flexible electronic device. In addition, by surrounding a channel by a multilayer film including a first blocking layer and coating a bonding part with a second blocking layer in order to prevent air from penetrating through the bonding part between upper and lower films, an inner portion of the channel may be maintained in a vacuum state and heat performance of the polymer-based pulsating heat pipe may be maintained. In addition, although the polymer-based pulsating heat pipe according to the present invention has high flexibility, it is lightweight and has heat performance superior to that of copper, thereby effectively cooling the flexible electronic device.

15 Claims, 12 Drawing Sheets

(51) Int. Cl.
   *H05K 7/20*      (2006.01)
   *B32B 3/26*      (2006.01)
   *B32B 27/08*     (2006.01)
   *B32B 27/32*     (2006.01)
   *B23P 15/26*     (2006.01)
   *B32B 37/00*     (2006.01)
   *H01L 23/427*    (2006.01)
   *F28F 21/08*     (2006.01)
   *F28F 21/06*     (2006.01)
   *B32B 38/00*     (2006.01)
   *H01L 23/373*    (2006.01)

(52) U.S. Cl.
   CPC .............. *B32B 27/08* (2013.01); *B32B 27/32* (2013.01); *B32B 37/0076* (2013.01); *F28D 15/025* (2013.01); *F28D 15/0233* (2013.01); *F28D 15/0283* (2013.01); *F28F 21/06* (2013.01); *F28F 21/089* (2013.01); *H01L 23/427* (2013.01); *H05K 7/20336* (2013.01); *B32B 2038/0092* (2013.01); *B32B 2255/10* (2013.01); *B32B 2255/205* (2013.01); *B32B 2307/7242* (2013.01); *F28F 2230/00* (2013.01); *F28F 2245/00* (2013.01); *F28F 2265/16* (2013.01); *H01L 23/3737* (2013.01)

(56) References Cited

OTHER PUBLICATIONS

Lim et al. "Fabrication of the polymer-based pulsating heat pipe and estimation of thermal performance according to various bending angles" The Korean Society of Mechanical Engineers, Dec. 15, 2016.

Lim, "Experimental study on the fabrication and thermal performance evaluation of a polymer-based flexible pulsating heat pipe," Korea Advanced Institute of Science and Technology, Jan. 9, 2017.

* cited by examiner

POLYMER-BASED PULSATING HEAT PIPE AND MANUFACTURING METHOD THEREOF

CROSS-REFERENCE TO RELATED APPLICATIONS

This application claims priority under 35 U.S.C. § 119 to Korean Patent Application No. 10-2017-0028331 filed on Mar. 6, 2017, in the Korean Intellectual Property Office, the disclosure of which is incorporated herein by reference in its entirety.

TECHNICAL FIELD

The following disclosure relates to a pulsating heat pipe, and more particularly, to a polymer-based pulsating heat pipe having flexibility so as to be applicable to a flexible electronic device and a manufacturing method thereof.

BACKGROUND

Various flexible electronic devices such as a smart watch, a wearable device, and the like have been recently developed. As performance of these devices increases, the amount of generated heat is also increased. In particular, local heat generation may occur in these electronic devices. As a result, it may cause an excessive temperature increase in a specific portion of the electronic devices, which may cause a problem in the electronic devices and may pose a safety risk to a user. Therefore, in order to solve the above-mentioned problems, it is necessarily required to apply a suitable heat dissipating device to these electronic devices.

As a heat dissipating device or a cooling device, a heat pipe is mainly used. A typical heat pipe includes an empty space and a wick structure. The thinner the heat pipe, the narrower the space in which a vaporized working fluid moves due to the wick structure thereof, which results in a rapid decrease in performance thereof. Therefore, there is a limit in applying the heat pipe to ultra-thin electronic devices. To overcome the above-mentioned problem, a pulsating heat pipe is proposed. As illustrated in FIG. 1, the pulsating heat pipe includes a smooth micro tube bundle without the wick structure, and an aligned slug-train unit including a liquid slug and a vapor plug in the tube pulsates and transfers heat. The pulsating heat pipe may be manufactured to be thin because it does not have the wick structure therein and has a simple structure, which is suitable for application to microelectronic devices.

As illustrated in FIG. 2, Korean Patent No. 1508126 discloses a flat plate pulsating heat pipe including a silicon wafer lower plate 21, a wafer upper plate 20, a capillary 30, a working fluid filled in the capillary, an evaporating part 40 positioned at one end in a length direction of the silicon wafer lower plate in the capillary and disposed at an external heat source, a condensing part 50 positioned at the other end in the length direction of the silicon wafer lower plate in the capillary and through which the working fluid heated by external heat radiates heat to the outside, and two through holes 33 used only to inject or discharge the working fluid. Since the conventional heat pipe and the pulsating heat pipe all undergo a process of injecting the working fluid while maintaining the inside thereof in a vacuum, the conventional heat pipe and the pulsating heat pipe are generally formed of a metal (mainly, copper or aluminum), glass, silicon, or the like, which may not be applicable to the electronic device requiring flexibility such as the smart watch, the wearable device, or the like.

RELATED ART DOCUMENT

Patent Document (Patent Document 1) Korean Patent No. 10-1508126

SUMMARY

An embodiment of the present invention is directed to providing a polymer-based pulsating heat pipe having flexibility which is applicable to a flexible electronic device, and a manufacturing method thereof.

In addition, in order to have flexibility, a channel of a pulsating heat pipe is formed of polymer having high flexibility. However, since the polymer is difficult to maintain a vacuum state, an embodiment of the present invention is directed to providing a pulsating heat pipe having a multilayer film including a metal layer bonded to the channel to maintain the vacuum state.

In addition, an embodiment of the present invention is directed to providing a pulsating heat pipe having a metal layer covering a bonding part in order to prevent air from penetrating through the bonding part between upper and lower films.

In one general aspect, a polymer-based pulsating heat pipe includes a base part having a flat plate shape in which a plurality of channels are formed, wherein the channels form a closed-loop in which both ends thereof are bent and connected to each other; an upper film bonded to an upper portion of the base part; and a lower film bonded to a lower portion of the base part and sealing the channels together with the upper film, wherein the base part is formed of a soft material, the upper film includes a first upper blocking layer for preventing gas penetration to maintain a vacuum state, and the lower film includes a first lower blocking layer for preventing the gas penetration to maintain the vacuum state.

At least one of the lowest layer of the upper film and the uppermost layer of the lower film which are bonded to the base part may be formed of the same material as that of the base part.

The base part may be formed of a polymer material.

The base part may be formed of low-density polyethylene (LDPE), and the lowest layer of the upper film and the uppermost layer of the lower film may be formed of linear low-density polyethylene (LLDPE).

One side of the upper film and one side of the lower film may be in contact with each other along a circumference of the base part to surround the base part, and an outer portion of a bonding part at which one side of the upper film and one side of the lower film are in contact with each other may be covered with a second blocking layer.

One side of the lowest layer of the upper film and one side of the uppermost layer of the lower film may be in contact with each other to form the bonding part, and the bonding part may be covered with the second blocking layer so that the lowest layer of the upper film and the uppermost layer of the lower film of the bonding part are not exposed to the outside.

An outer side of the second blocking layer may be covered with a protective layer.

The polymer-based pulsating heat pipe may further include an inner portion blocking layer formed on inner surfaces of the base part forming the channels, the upper film, and the lower film.

In another general aspect, a manufacturing method of a polymer-based pulsating heat pipe includes (a) forming a plurality of channels in which both ends thereof are bent and connected to each other to form a closed loop in a base part of a flat plate shape; and (b) each bonding an upper film and a lower film to an upper portion and a lower portion of the base part by each disposing the upper film and the lower film on the upper portion and the lower portion of the base part and then applying heat and pressure in a direction of the base part from each of the upper film and the lower film, wherein the base part is formed of a soft material, the upper film includes a first upper blocking layer for preventing gas penetration to maintain a vacuum state, and the lower film includes a first lower blocking layer for preventing the gas penetration to maintain the vacuum state.

The base part, and the lowest layer of the upper film and the uppermost layer of the lower film which are bonded to the base part may be formed of a polymer material, and in the operation (b), a sealing may be performed between the base part and the lowest layer of the upper film and between the base part and the uppermost layer of the lower film by a heat sealing.

The manufacturing method may further include (c) disposing one side of the lowest layer of the upper film and one side of the uppermost layer of the lower film to be in contact with each other according to a circumference of the base part in order to surround the base part; (d) forming a bonding part by applying heat and pressure to the bonding part at which one side of the lowest layer of the upper film and one side of the uppermost layer of the lower film are in contact with each other; and (e) covering an outer portion of the bonding part with a second blocking layer so that the lowest layer of the upper film and the uppermost layer of the lower film of the bonding part are not exposed to the outside.

The manufacturing method may further include (f) covering an outer side of the second blocking layer with a protective layer.

The operation (b) may include (b-1) disposing one of the upper film and the lower film on the base part and thermally sealing the base part and the disposed film to each other, (b-2) disposing a screen on a side on which the film is not disposed among an upper portion and a lower portion of the base part, (b-3) forming an inner portion blocking layer on a side surface of the base part forming the channels and an inner surface of the film disposed in the operation (b-1), and (b-4) removing the screen, disposing the film that has the inner portion blocking layer formed on the inner surface thereof and is not disposed in the operation (b-1) in the base part, and then thermally sealing the base part and the film to each other.

In the operation (b-3), the inner portion blocking layer may be formed using vapor deposition or atomic layer deposition (ALD).

DETAILED DESCRIPTION OF MAIN ELEMENTS

Figure 1:
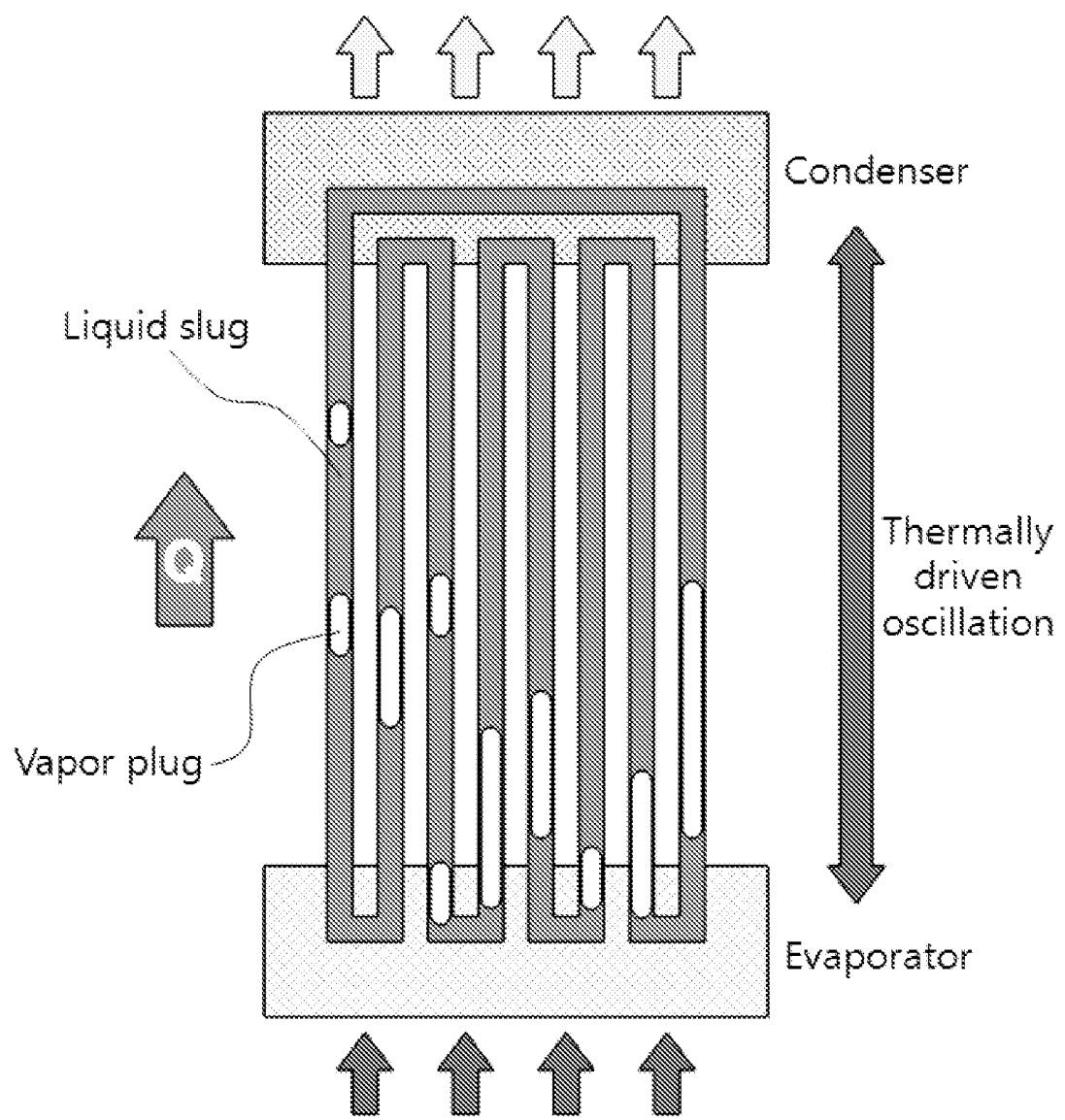
FIG. 1 is a schematic view illustrating an operation principle of a typical pulsating heat pipe.
Figure 2:
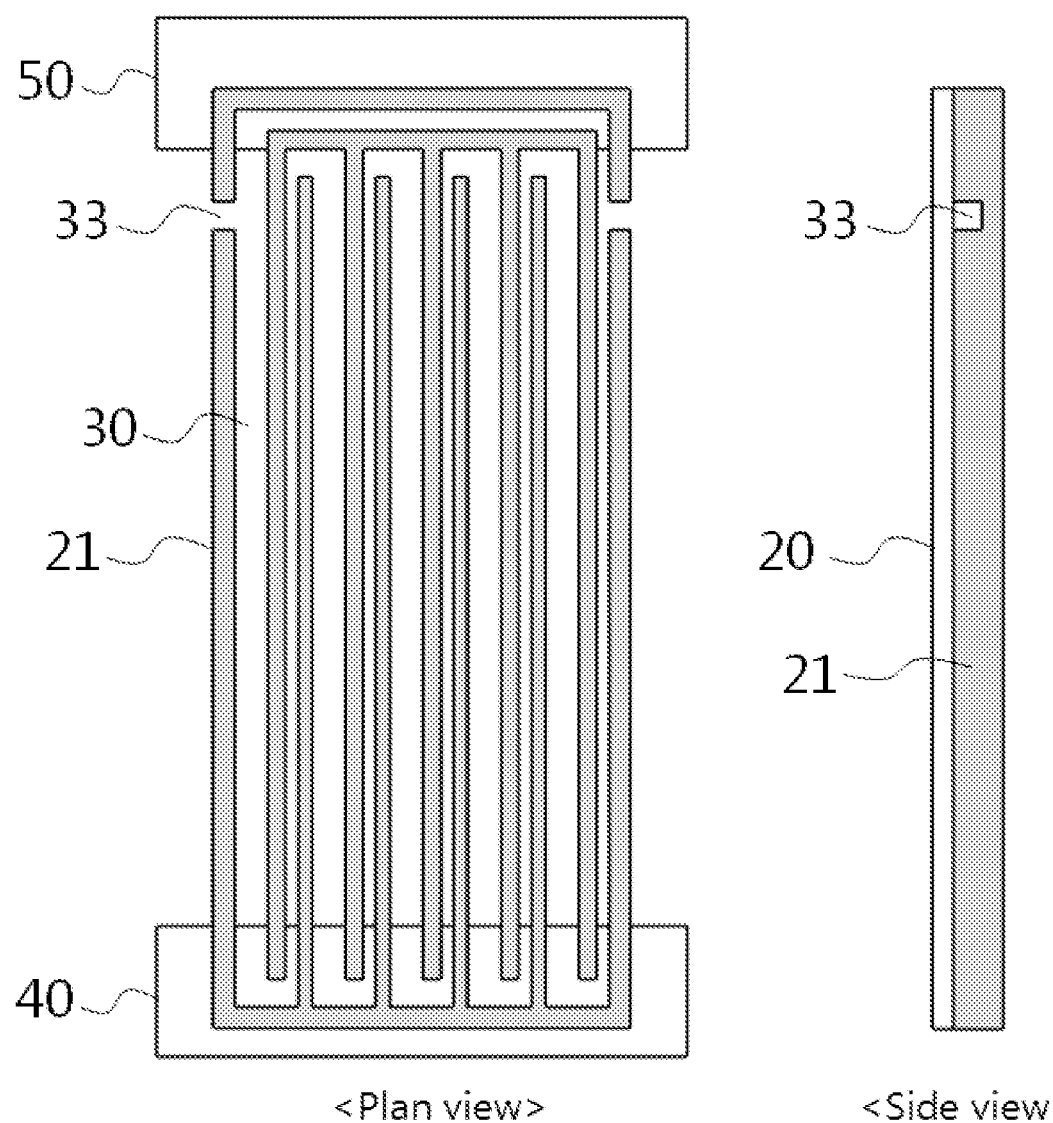
FIG. 2 is a configuration view of a flat plate pulsating heat pipe illustrated in the related art.

10: polymer-based pulsating heat pipe
100: base part
200: upper film
210: lowest layer of upper film
220: first upper blocking layer of upper film
230: uppermost layer of upper film
300: lower film
310: uppermost layer of lower film
320: first lower blocking layer of lower film
330: lowest layer of lower film
400: bonding part
410: second blocking layer
420: protective layer
500: inner portion blocking layer

DETAILED DESCRIPTION OF EMBODIMENTS

Hereinafter, a polymer-based pulsating heat pipe 10 according to the present invention will be described with reference to the accompanying drawings.

Figure 3A:
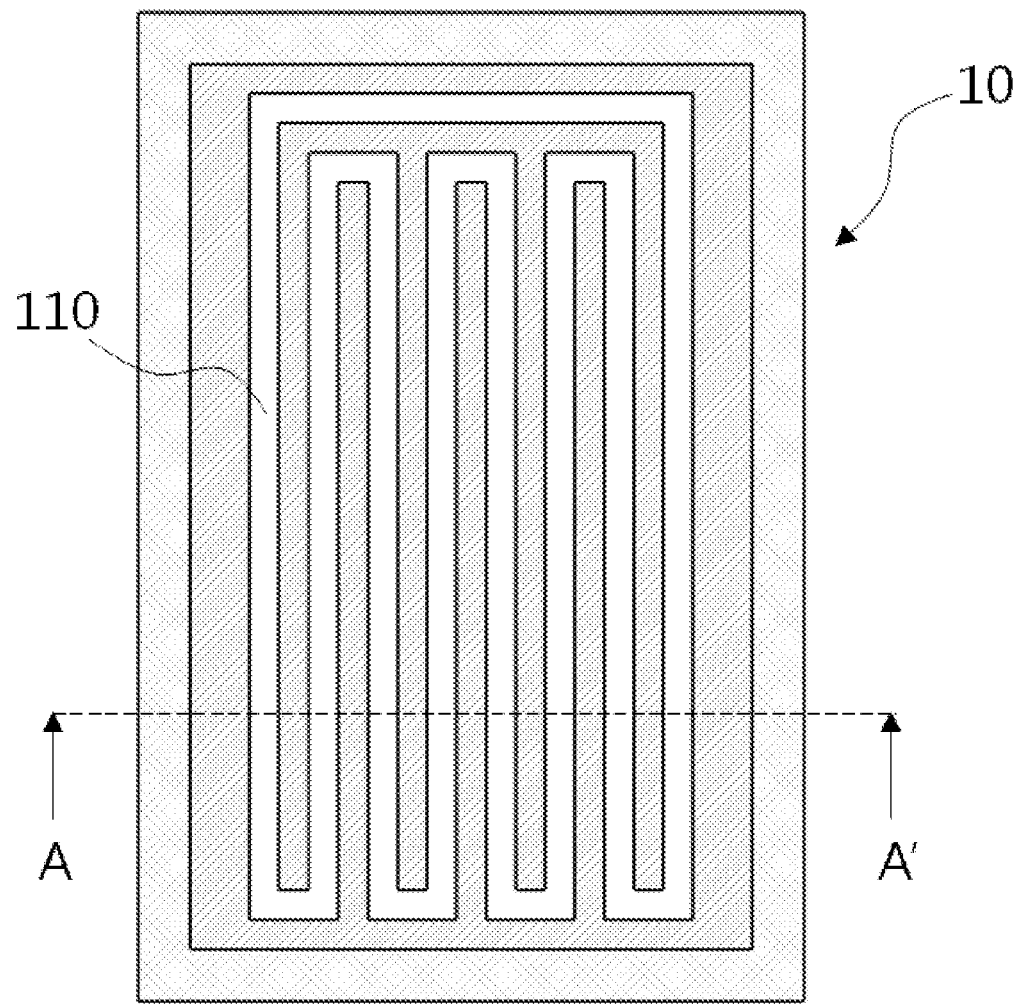
FIGS. 3A and 3B are schematic views of a polymer-based pulsating heat pipe according to a first exemplary embodiment of the present invention.
Figure 3B:
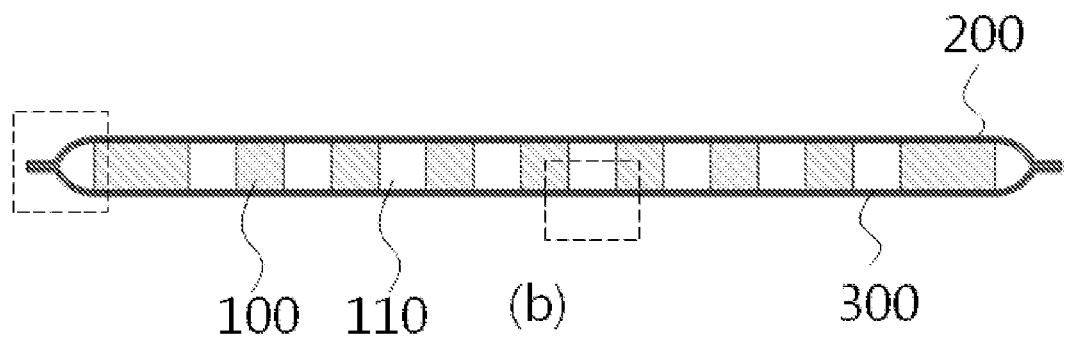
Figure 4A:
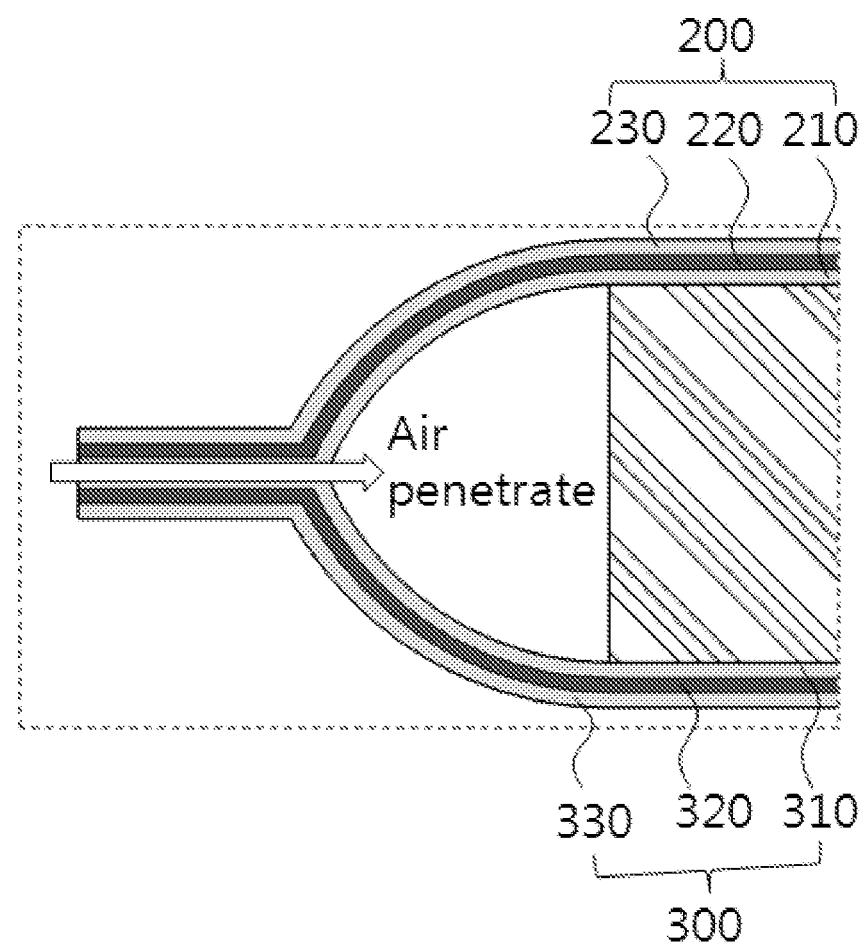
FIGS. 4A and 4B show a partially enlarged view of FIGS. 3A and 3B.
Figure 4B:
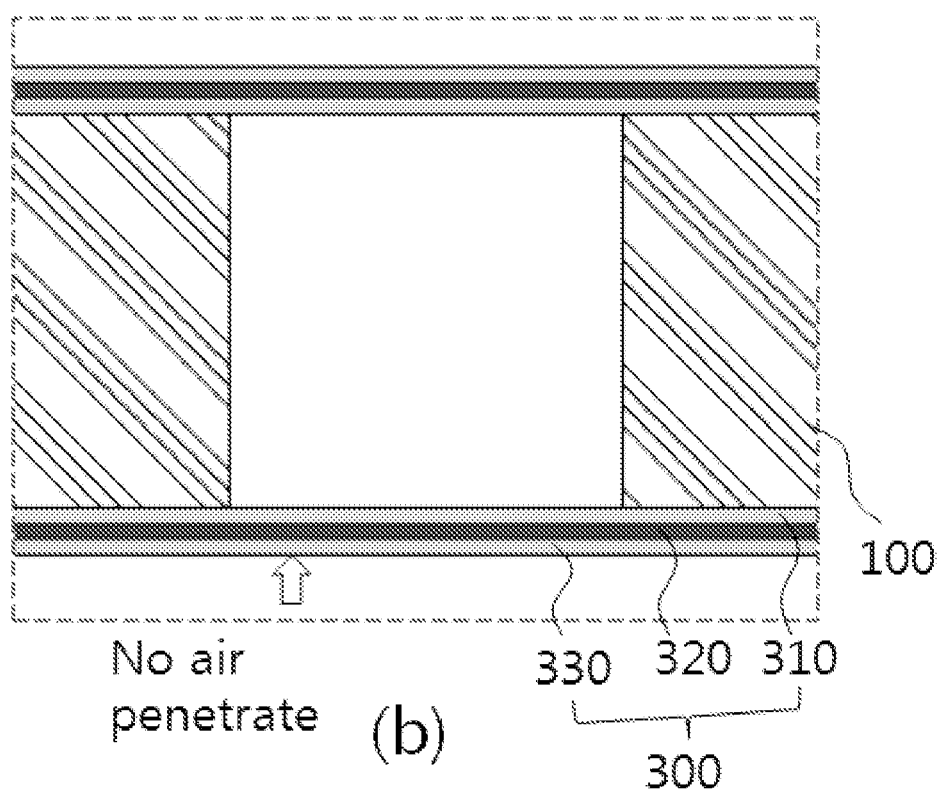

FIG. 3A is a schematic view of a polymer-based pulsating heat pipe according to a first exemplary embodiment of the present invention and FIG. 3B is a cross-sectional view taken along a line A-A'. FIGS. 4A and 4B illustrate a detailed structure of the polymer-based pulsating heat pipe. The polymer-based pulsating heat pipe 10 includes a base part 100 having a flat plate shape in which a plurality of channels 110 are formed, wherein the channels form a closed-loop in which both ends thereof are bent and connected to each other; an upper film 200 bonded to an upper portion of the base part 10; and a lower film 300 bonded to a lower portion of the base part 100 and sealing the channels 110 together with the upper film 200, wherein the base part 100 is formed of a soft material, the upper film 200 includes a first upper blocking layer 220 for preventing gas penetration to maintain a vacuum state, and the lower film 300 includes a first lower blocking layer 320 for preventing the gas penetration to maintain the vacuum state.

The polymer-based pulsating heat pipe may further include a working fluid filled in the channels 110.

Since the base part 100, and at least one of a lowest layer 210 of the upper film and an uppermost layer 310 of the lower film which are bonded to the base part 100 is formed of a soft material, the pulsating heat pipe may be freely bent and may be applicable to a flexible electronic device.

More specifically, the base part 100, the lowest layer 210 of the upper film, or the uppermost layer 310 of the lower film may be formed of the same kind of polymer material. In particular, the base part 100 may be formed of a low-density polyethylene (LDPE) material, and the lowest layer 210 of the upper film and the uppermost layer 310 of the lower film may be formed of a liner low-density polyethylene (LLDPE) material.

However, the present invention does not limit the material of the lowest layer 210 of the upper film and the uppermost layer 310 of the lower film to the same kind of material as each other as described above, and the lowest layer 210 of the upper film and the uppermost layer 310 of the lower film may be formed of different materials, as needed. For example, in a case in which it is necessary to discharge heat to a lower portion without discharging the heat to an upper side on the basis of the cross-sectional view according the first exemplary embodiment of the present invention illustrated in FIG. 3B, the lowest layer 210 of the upper film is formed of a material having low thermal conductivity and the uppermost layer of the lower film is formed of a material having high thermal conductivity, such that it is possible to limit a direction in which the heat is discharged.

An upper film 200 is bonded to the upper portion of the base part 100 and a lower film 300 is bonded to the lower portion of the base part 100, such that the channels in the base part 100 are sealed. Here, the bonding between the base part 100 and the lowest layer 210 of the upper film may be performed by heat sealing. The heat sealing refers to a case in which when the same kind of two polymer members are in contact with each other and heat and pressure are then applied thereto, a polymer chain diffuses through the contact surface and the two polymer members are bonded to each other. According to the present invention, the base part 100 and the lowest layer 210 of the upper film are allowed to be in contact with each other and proper heat and pressure are then applied thereto, thereby bonding the base part 100 and the lowest layer 210 of the upper film to each other. This process is applied in the same way to bonding the base part 100 and the uppermost layer 310 of the lower film to each other.

The present invention uses the low-density polyethylene (LDPE) material in the base part 100 and uses the linear low-density polyethylene (LLDPE) material in the lowest layer 210 of the upper film and the uppermost layer 310 of the lower film, but a combination of different kind of thermoplastic resins which may be bonded to each other through the heat sealing may also be used.

In addition, the upper film 200 and the lower film 300 may be formed in a multilayer, and the uppermost layer 230 of the upper film and the lowest layer 330 of the lower film may be formed of a material having excellent chemical resistance and durability so that the upper film 200 and the lower film 300 serve as an outer cover protecting the polymer-based pulsating heat pipe. The uppermost layer 230 of the upper film and the lowest layer 330 of the lower film may be formed of a polymer material having excellent chemical resistance and durability, and may be particularly formed of polyethylene terephthalate (PET).

In addition, each of the first upper blocking layer 220 of the upper film and the first lower blocking layer 320 of the lower film may further have an upper layer and a lower layer formed on an upper portion and a lower portion thereof.

Figure 5:
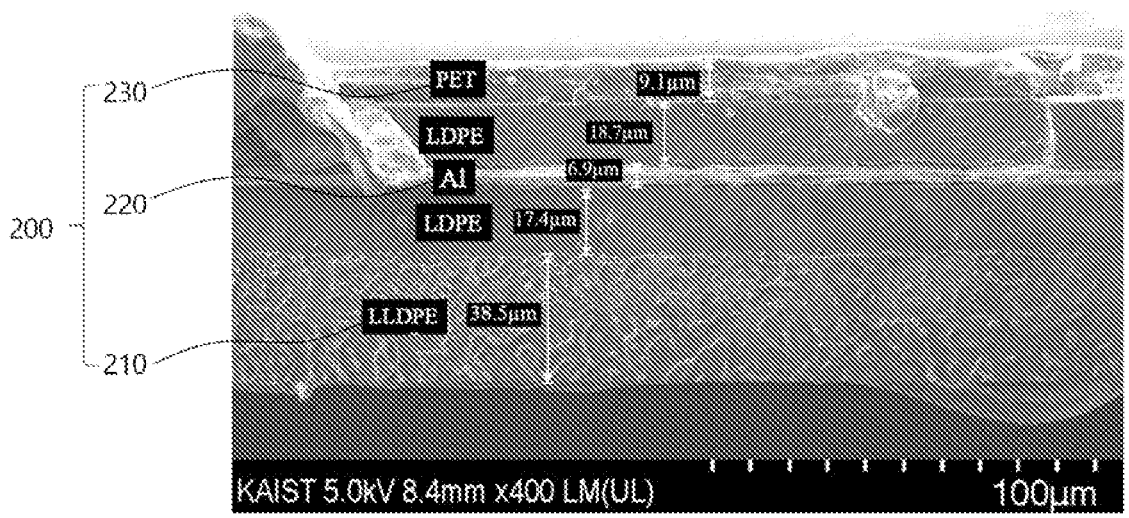
FIG. 5 is a cross-sectional view of an upper film formed in five layers according to the present invention.

FIG. 5 illustrates an exemplary embodiment of an upper film according to the present invention. As illustrated in FIG. 5, the upper layer and the lower layer are each formed on the upper portion and the lower portion of the first upper blocking layer 220 of the upper film 200, that is, between the first upper blocking layer 220 and the uppermost layer 230 of the upper film and between the first upper blocking layer 220 and the lowest layer 210 of the upper film, such that the upper film 200 may be formed in a total of five layers. The upper layer and the lower layer formed on each of the upper portion and the lower portion of the first upper blocking layer 220 may be formed of a low-density polyethylene (LDPE) material. In this case, the lowest layer 210 of the upper film may be linear low-density polyethylene and the uppermost layer 230 of the upper film may be formed of polyethylene terephthalate.

Since the polymer materials such as low-density polyethylene, polyethylene terephthalate, and the like have high gas permeability, it is difficult to maintain the inner portion of the channel in a vacuum state. Therefore, in order to prevent penetration of air, the upper film 200 and the lower film 300 may each include the first upper blocking layer 220 and the first lower blocking layer 320. Each of the first upper blocking layer 220 of the upper film and the first lower blocking layer 320 of the lower film may be formed of various metal materials such as copper (Cu), and the like, and may be preferably formed of an aluminum (Al) material. In addition, each of the first upper blocking layer 220 of the upper film and the first lower blocking layer 320 of the lower film needs to be formed of a very thin metal layer to have softness. However, if each of the first upper blocking layer 220 of the upper film and the first lower blocking layer 320 of the lower film is too thin, the effect thereof as the blocking layer is deteriorated. Therefore, a thickness of each of the first upper blocking layer 220 of the upper film and the first lower blocking layer 320 of the lower film is preferably 10 μm or less.

In FIG. 5, the upper film 200 may be formed in a total of five layers and the lower film may be formed in a total of five layers in the same way as the upper film, but the present invention is not limited thereto and each of the upper film 200 and the lower film may be formed in three layers. That is, the upper film and the lower film are formed in different numbers of layers as needed, such that various effects such as the effect of limiting the direction in which the heat is discharged by forming the lowest layer 210 of the upper film and the uppermost layer 310 of the lower film of different materials as described above may be obtained.

In order to maintain the inner portion of the channel in the vacuum state, the base part 100 may be fully surrounded by the upper film 200 and the lower film 300. As illustrated in FIGS. 4A and 4B, an area of each of the upper film 200 and the lower film 300 is greater than that of the base part 100, one side of the upper film 200 and one side of the lower film 300 are in contact with each other along a circumference of the base part 100 to surround the base part 100, and a bonding part 400 at which one side of the upper film 200 and one side of the lower film 300 are in contact with each other may be formed. Specifically, one side of the lowest layer 210 of the upper film and one side of the uppermost layer 310 of the lower film are in contact with each other and are bonded to each other, such that the bonding part 400 is formed.

As illustrated in FIGS. 4A and 4B, since the upper film 200 and the lower film 300 on the upper surface and the lower surface of the base part 100 include the first blocking layer, the air does not penetrate into the inner portion of the channel. On the other hand, since the bonding part 400 does not have the metal layer between the channel and the outside, the air may penetrate into the inner portion of the channel through a side surface of the bonding part 400. Therefore, in order to prevent the penetration of the air by preventing the lowest layer 210 of the upper film and the uppermost layer 310 of the lower film of the bonding part 400 from being exposed to the outside, an outer portion of the bonding part 400 may be covered with the second blocking layer 410.

Figure 6:
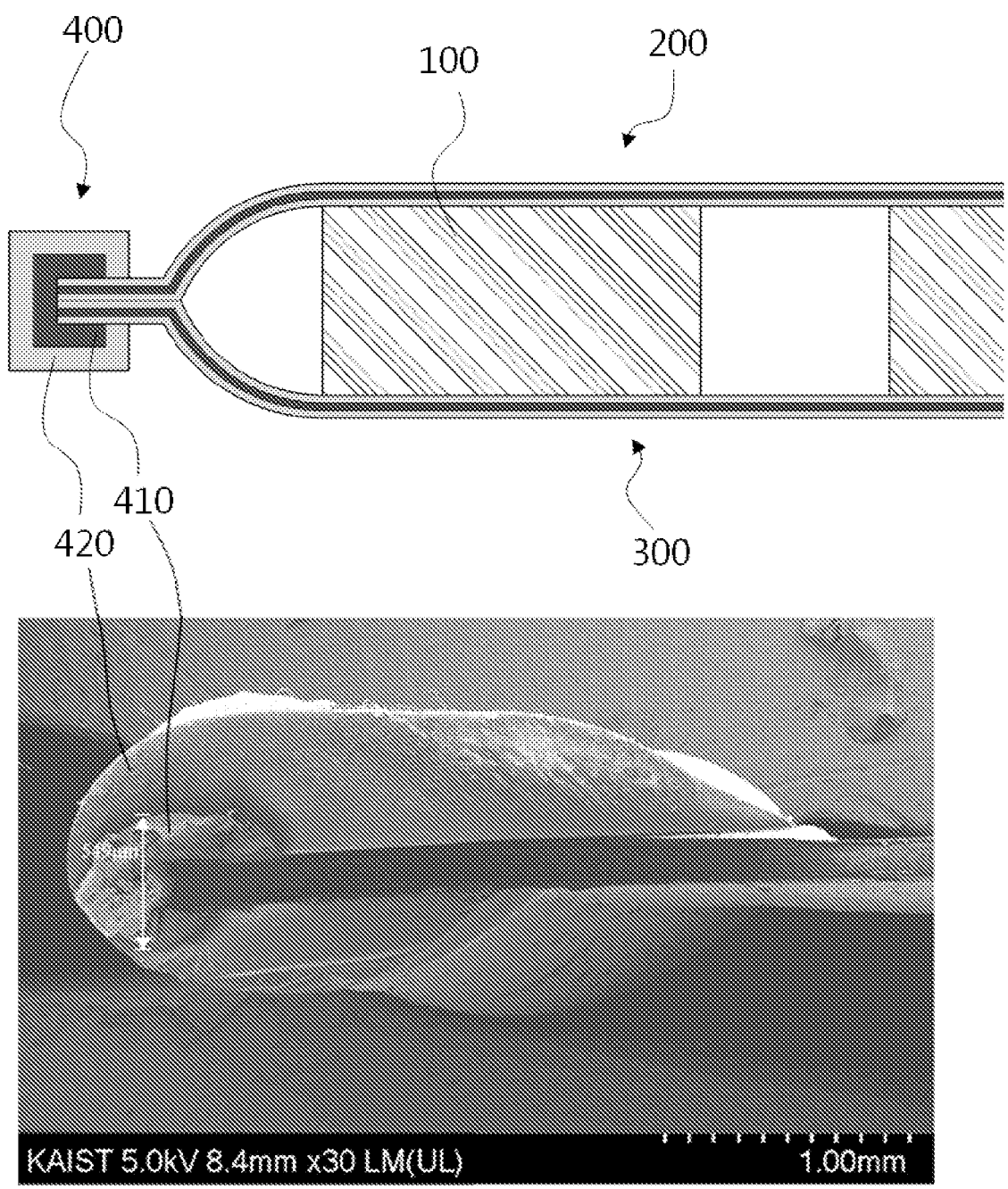
FIG. 6 is a cross-sectional view of a second blocking layer and an ultraviolet (UV) resin layer covering a bonding part according to the present invention.
Figure 7:
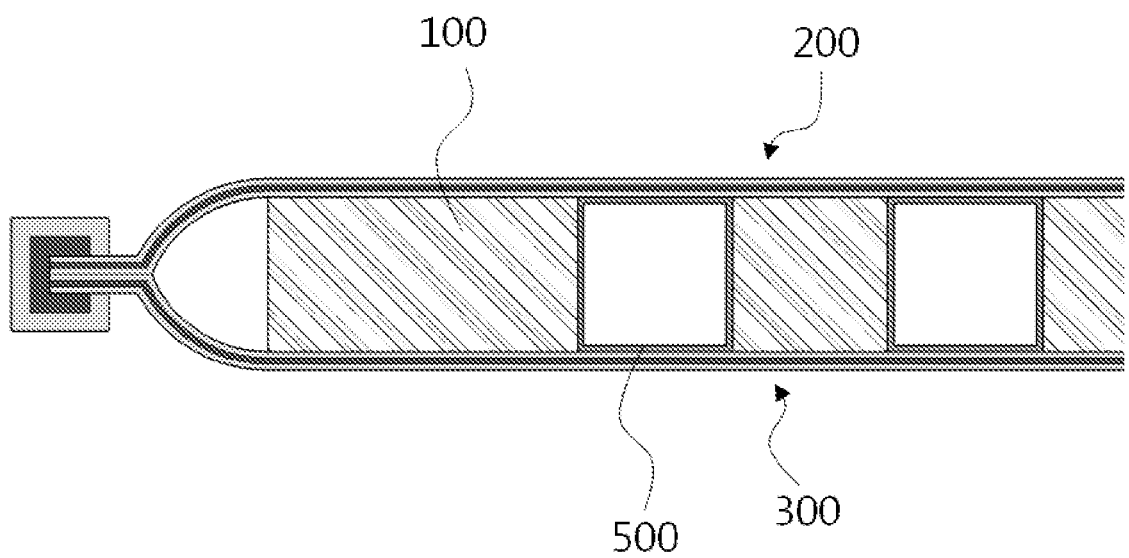
FIG. 7 is a schematic view of a polymer-based pulsating heat pipe according to a second exemplary embodiment of the present invention.

As illustrated in FIGS. 4A and 4B, since the air may penetrate into the inner portion of the channel from the outer portion of the bonding part at which an end of the upper film 200 and an end of the lower film 300 are in contact with each other, it is possible to prevent the air from penetrating into the inner portion of the channel by coating this outer portion with the second blocking layer 410 as illustrated in FIG. 6. The second blocking layer 410 may be formed of any metal as long as it has high softness and may easily coat the bonding part 400, and since indium is one of most flexible metals, it is suitable for coating the bonding part 400.

In addition, since the second blocking layer 410 includes the metal, it is not as flexible as a polymer material, and may be separated from the bonding part 400 in a process of bending the pulsating heat pipe. In order to prevent this problem, an outer side of the second blocking layer 410 may be covered with a protective layer 420 formed of a soft material. In particular, the protective layer 420 may be formed of an ultra violet (UV)-resin to protect the second blocking layer 410. It may be seen from a right cross-sectional view of FIG. 6 that the outer portion of the bonding part 400 at which an end of the lowest layer 210 of the upper film and an end of the uppermost layer 410 of the lower film are in contact with each other is blocked by an indium layer 410, and an UV resin layer 420 surrounds the indium layer 410. As a result, it is possible to prevent the air from penetrating into the inner portion of the channel.

The polymer-based pulsating heat pipe is vulnerable to the penetration of the air (or noncondensed gas) into the inner portion thereof, and the air penetrating into the inner portion thereof has an adverse effect on performance of the pulsating heat pipe. Therefore, a lifespan of the polymer-band pulsating heat pipe is determined by an amount of air penetrating into the inner portion thereof. As described above, according to the present invention, by surrounding the base part by the multilayer film including the first blocking layer and coating the bonding part between the upper and lower films with the second blocking layer in order to prevent the air from penetrating into the inner portion of the channel, the inner portion of the channel may be maintained in the vacuum state and the performance of the pulsating heat pipe may be maintained.

FIGS. 8A-8D an enlarged cross section of a polymer-based pulsating heat pipe according to a second exemplary embodiment of the present invention.

As illustrated in FIGS. 8A-8D, a polymer-based pulsating heat pipe according to a second exemplary embodiment of the present invention may further include an inner portion blocking layer 500 in addition to the components of the first exemplary embodiment.

As illustrated in FIGS. 8A-8D, the inner portion blocking layer 500 is a kind of metal layer coated over an inner surface of the base part 100 forming the channel, an inner surface of the upper film 200, and an inner surface of the lower film 300. The inner portion blocking layer 500 serves to prevent the gas from penetrating into the inner portion of the channel from the outside in the same way as the first upper blocking layer 220 and the first lower blocking layer 320 and increases durability of the base part 100, the upper film 200, and the lower film 300, thereby making it possible to extend the lifespan of the polymer-based pulsating heat pipe according to the present invention.

Hereinafter, a manufacturing method of a polymer-based pulsating heat pipe according to a first exemplary embodiment of the present invention capable of preventing air from penetrating into an inner portion thereof will be described.

Figure 8:
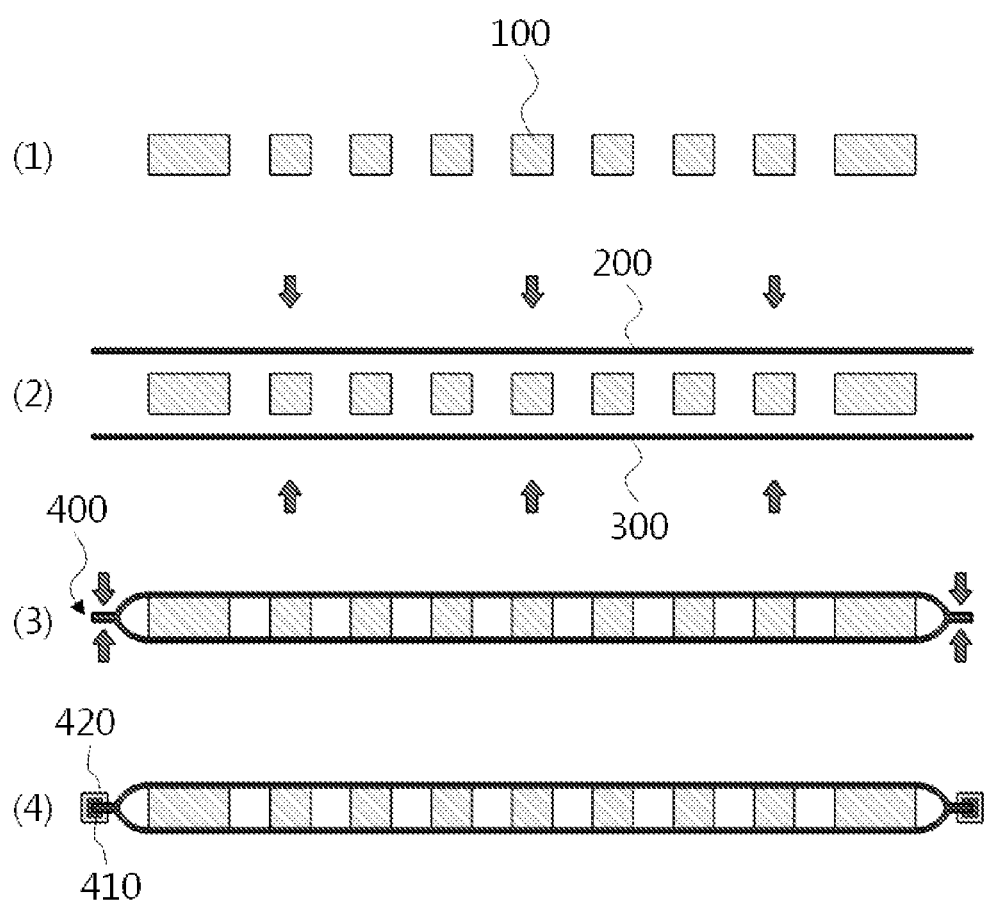
FIGS. 8A-8D provide a flowchart of a manufacturing method of a polymer-based pulsating heat pipe according to the present invention.

First, the manufacturing method of the polymer-based pulsating heat pipe according to the first exemplary embodiment of the present invention includes (a) an operation of forming a plurality of channels in which both ends thereof are bent and connected to each other to form a closed loop in a base part of a flat plate shape (corresponding to FIG. 8A) and (b) an operation of each bonding an upper film and a lower film to an upper portion and a lower portion of the base part by each disposing the upper film and the lower film on the upper portion and the lower portion of the base part and then applying heat and pressure in a direction of the base part from each of the upper film and the lower film (corresponding to FIG. 8B). Here, the base part 100 is formed of a soft material, the upper film 200 includes a first upper blocking layer 220 to prevent gas penetration and maintain a vacuum state, and the lower film 300 includes a first lower blocking layer 320 to prevent the gas penetration and maintain the vacuum state, such that the polymer-based pulsating heat pipe may have softness and may maintain the vacuum state.

More specifically, the base part 100, and the lowest layer 210 of the upper film and the uppermost layer 310 of the lower film which are bonded to the base part 100 may be formed of a polymer material. Thereby, in the operation (b) of bonding the films to the upper portion and the lower portion of the base part, a sealing between the base part 100 and the lowest layer 210 of the upper film and between the base part 100 and the uppermost layer 310 of the lower film may be performed by a heat sealing.

As described above, bonding the upper film 200, the lower film 300, and the base part 100 interposed between the upper film 200 and the lower film 300 to each other by applying heat and pressure to the upper film 200, the lower film 300, and the base part 100 is referred to as a heat sealing method. This heat sealing method refers to a case in which when two polymer members are in contact with each other and heat and pressure are then applied thereto, a polymer chain diffuses through the contact surface and the two polymer members are bonded to each other.

The base part 100 is formed of a low-density polyethylene (LDPE) material, the lowest layer 210 of the upper film and the uppermost layer 310 of the lower film are preferably formed of a linear low-density polyethylene (LLDPE) material, but a combination of different kinds of thermoplastic resins which may be bonded to each other through the heat sealing may also be used.

In addition, the manufacturing method of the polymer-based pulsating heat pipe according to the present invention may further include an operation of removing dust on a surface of the base part 100 using ethanol and pure water between the operation (a) of disposing the base part 100 and forming the channel and the process of disposing the upper film and the lower film of the operation (b).

In addition, when the upper film 200 and the lower film 300 are each bonded to the upper portion and the lower portion of the base part 100, the upper film 200 and the lower film 300 may also be each bonded to the upper portion and the lower portion of the base part 100 by simultaneously applying heat and pressure in the direction of the base part 100 from each of the upper film 200 and the lower film 300, and the upper film 200 and the lower film 300 may also be separately bonded to the base part 100. Specifically, first, the upper film 200 may be disposed on the upper portion of the base part 100, the upper film 200 may be bonded to the upper portion of the base part 100 by applying heat and pressure in the direction of the base part 100 from the upper film 200, and the lower film 300 may be bonded to the lower portion of the base part 100 in the same way.

In addition, as described above, the uppermost layer 230 of the upper film and the lowest layer 330 of the lower film are formed of polyethylene terephthalate (PET), and the upper layer and the lower layer of each of the first upper blocking layer 220 of the upper film and the first lower blocking layer 320 of the lower film are preferably formed of a low-density polyethylene (LDPE) material.

In addition, as described above, each of the first upper blocking layer 220 of the upper film and the first lower blocking layer 320 of the lower film is formed of an aluminum (Al) material, and each of the first upper blocking layer 220 of the upper film and the first lower blocking layer 320 of the lower film is preferably formed to have a thickness of 10 μm or less.

In addition, the manufacturing method may further include, after the operation (b) of bonding the films to the upper portion and the lower of the base part, an operation (c) of disposing one side of the lowest layer 210 of the upper film and one side of the uppermost layer 310 of the lower film to be in contact with each other according to a circumference of the base part 100, in order to surround the base part 100, an operation (d) of bonding a bonding part 400 by applying heat and pressure to the bonding part 400 at which one side of the lowest layer 210 of the upper film and one side of the uppermost layer 310 of the lower film are in contact with each other (the operations (c) and (d) correspond to FIG. 8C), and an operation (e) of covering an outer portion of the bonding part 400 with a second blocking layer 410 so that the lowest layer 210 of the upper film and the uppermost layer 310 of the lower film of the bonding part 400 are not exposed to the outside (corresponding to FIG. 8D). In this case, an area of each of the upper film 200 and the lower film 300 is greater than that of the base part 100, such that the upper film 200 and the lower film 300 may surround the entirety of the base part 100.

Specifically, in the operation (e) of forming the second blocking layer, a side surface of the polymer-based pulsating heat pipe, that is, the bonding part 400 portion is covered with indium and the lowest layer 210 of the upper film and the uppermost layer 310 of the lower film are coated with the indium layer, thereby making it possible to prevent air from penetrating into an inner portion of a channel through the bonding part 400.

In addition, in the operation (d) of bonding the bonding part, the bonding may be performed except for a portion into which a silica tube injecting a working fluid into the inner portion of the channel may be inserted. Here, the manufacturing method may further include, after the operation (d), an operation of fixing the silica tube to the polymer-based pulsating heat pipe by inserting the silica tube into a portion in which the bonding is not performed and applying a vacuum epoxy around the silica tube.

In addition, as described above, in order to prevent the penetration of air, the outer portion of the bonding part 400 is covered with the second blocking layer 410, and the second blocking layer 410 is preferably formed of an indium material.

In addition, as described above, in order to prevent the second blocking layer 410 from being separated from the bonding part 400 in the process of bending the polymer-based pulsating heat pipe, the manufacturing method may further include, after the operation (e) of forming the second blocking layer, an operation (f) of covering an outer side of the second blocking layer 410 with a protective layer 420 (corresponding to FIG. 8D). Specifically, the protective layer 420 may be formed of a flexible UV-curing resin and may protect the second blocking layer 410 by covering the second blocking layer 410, applying UV to the second blocking layer 410, and hardening the second blocking layer 410.

Thereafter, the inner portion of the channel becomes a vacuum state through the silica tube, the working fluid is injected thereinto, and the silica tube is disconnected, thereby completing the polymer-based pulsating heat pipe.

Figure 9A:
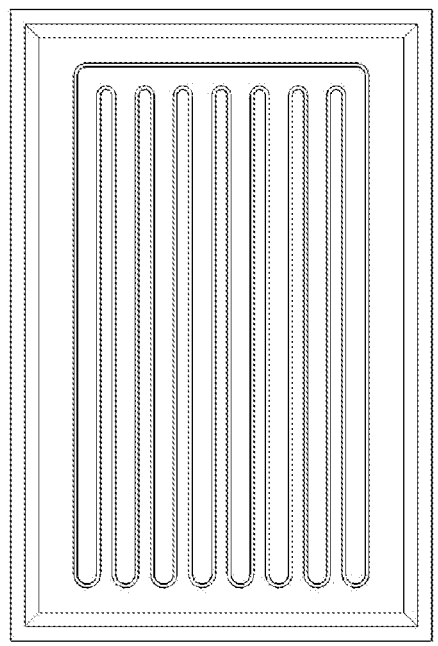
FIGS. 9A-9B are actual photographs of the polymer-based pulsating heat pipe according to the present invention.
Figure 9B:
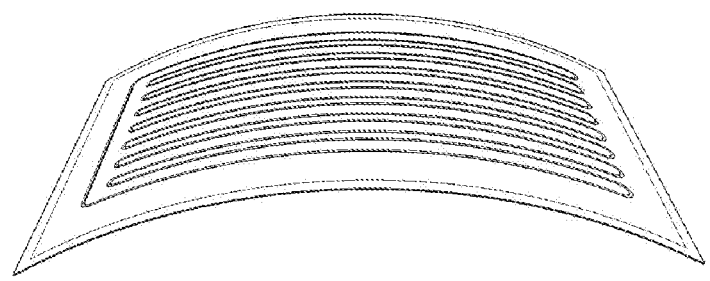

FIGS. 9A-9B illustrate an actual appearance of the polymer-based pulsating heat pipe according to the present invention and illustrates that the polymer-based pulsating heat pipe has high flexibility. It may be seen from FIGS. 9A-9B that the polymer-based pulsating heat pipe may be applied to a flexible electronic device.

Figure 10:
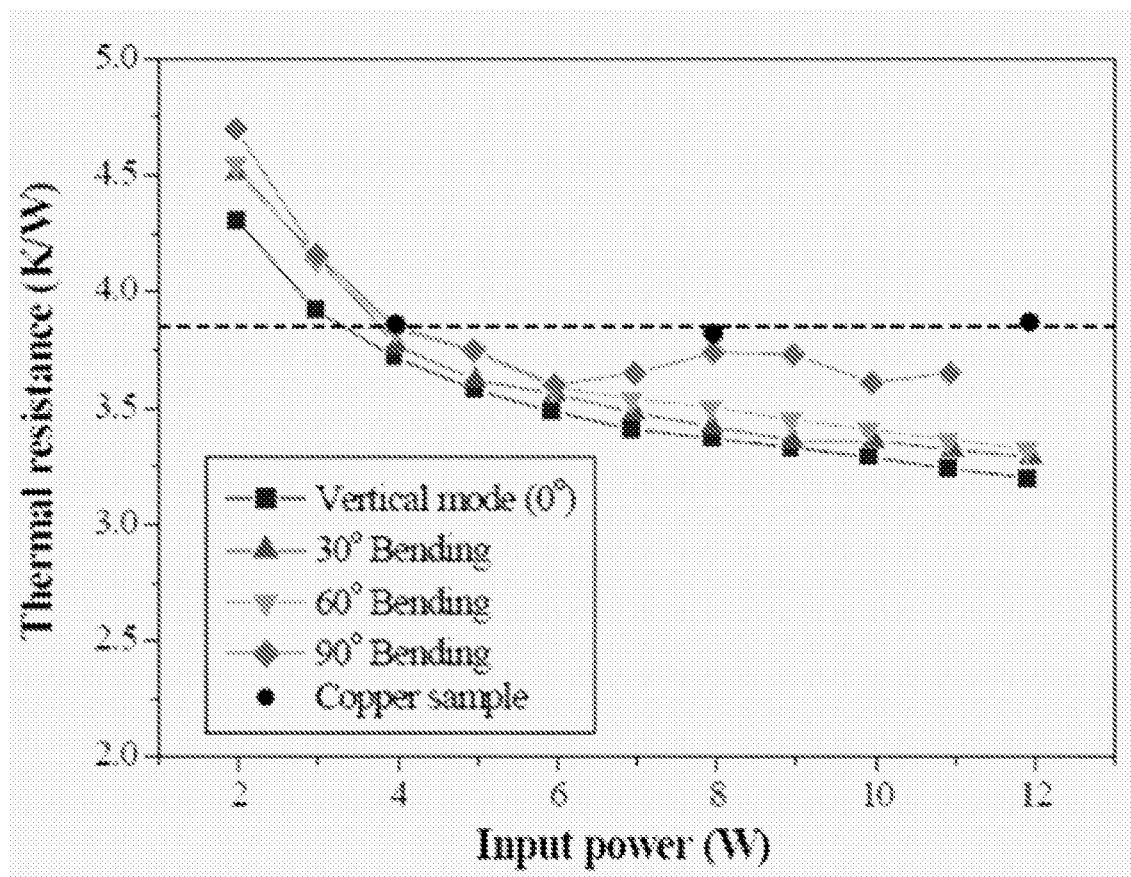
FIG. 10 is a graph illustrating thermal resistance of the polymer-based pulsating heat pipe according to the present invention.

In addition, FIG. 10 is a graph comparing thermal resistance according to a bending angle of the polymer-based pulsating heat pipe according to the present invention with thermal resistance of a copper specimen (attaching an upper film and a lower film to copper). The lower the thermal resistance, the better the thermal performance. It may be seen that the thermal performance of the polymer-based pulsating heat pipe is higher than the copper specimen when input power is higher than a predetermined level. In addition, even if the polymer-based pulsating heat pipe according to the present invention is bent by about 90°, it exhibits the thermal performance higher than that of the copper specimen. Therefore, the polymer-based pulsating heat pipe according to the present invention is lightweight and has excellent thermal performance in spite of having high flexibility, and thus it may be seen that it is an excellent cooling device applicable to the flexible electronic device.

Hereinafter, a manufacturing method of the polymer-based pulsating heat pipe according to the second exemplary embodiment of the present invention described above will be described in detail with reference to FIGS. 11A-11D.

First, in the manufacturing method of the polymer-based pulsating heat pipe according to the second exemplary embodiment of the present invention, the operation (b) may include operations (b-1), (b-2), (b-3), and (b-4) described above to form an inner portion blocking layer 500 in the inner portion of the channel, unlike that the upper film and the lower film illustrated in FIGS. 8A-8D are simultaneously thermal-sealed to the base part.

Figure 11:
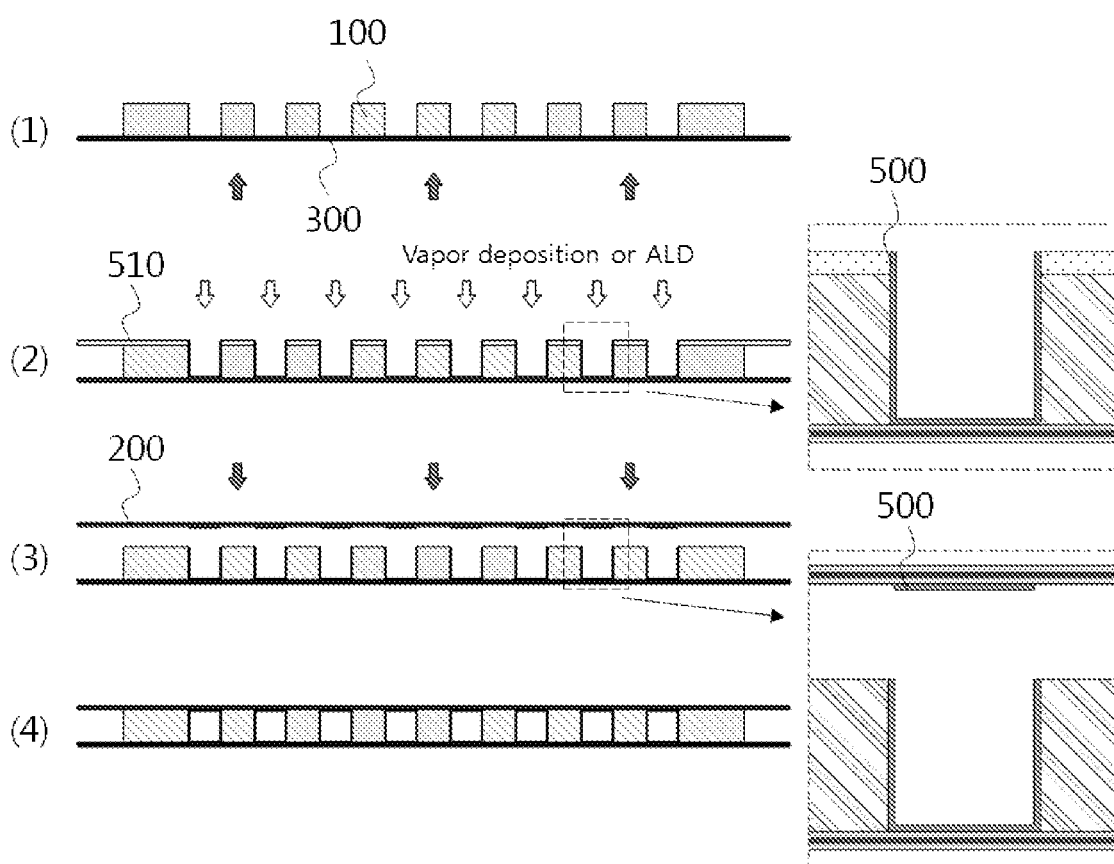
FIGS. 11A-11D provide a detailed flowchart of a manufacturing method of a step (b) according to the present invention.

Specifically, as illustrated in an operation of FIG. 11A, in the operation (b-1), the lower film 300 is disposed on the lower portion of the base part 100, and the base part 100 and the lower film 300 are then thermally sealed.

As illustrated in FIG. 11B, in the operation (b-2), after a screen 510 is disposed on the upper portion of the base part 100, an inner portion blocking layer 500 is formed on a side surface of the base part 100 and an inner surface of the lower film 300 forming the channel in the operation (b-3). The method for forming the inner portion blocking layer 500 in the operation (b-3) may be vapor deposition or atomic layer deposition (ALD). The inner portion blocking layer 500 may be formed of one of the metals formed in the first upper blocking layer 220 or the first lower blocking layer 320, and may be formed of copper (Cu) or aluminum (Al) as some examples.

In the operation (b-4), after the operation (b-3), the screen 510 is removed, the upper film 200 having the inner portion blocking layer 500 formed on the inner surface thereof is disposed on the upper portion of the base part 100, and the upper film 200 is then thermally sealed to the upper portion of the base part 100 as illustrated in FIG. 11C, such that the base part, the upper film and the lower film thermally sealed to the base part, and the inner portion blocking layer formed in the inner portion of the channel as illustrated in FIG. 11D may be formed.

A method for forming the inner portion blocking layer 500 on the inner surface of the upper film 200 in the operation (b-4) uses the screen and the vapor deposition or atomic layer deposition (ALD) method used in the operations (b-2) and (b-3). After a portion to be thermally sealed to the base part 100 among the inner surface of the upper film 200 is covered with the screen, the inner portion blocking layer 500 is formed by the vapor deposition or atomic layer deposition (ALD) method.

FIG. 11D is a state in which the inner portion blocking layer 500 is formed in the state in which the upper film 200 and the lower film 300 are each thermally sealed to the upper portion and the lower portion of the base part in FIG. 8B. Thereafter, operations (c) to (f) are performed in the same way as that described above, such that the polymer-based pulsating heat pipe may be manufactured.

However, although FIGS. 11A-11D describe the exemplary embodiment in which the lower film 300 is disposed on the lower portion of the base part 100 and is thermally sealed thereto, and the upper film 200 is then disposed and is thermally sealed in the operation (b-1), the present invention is not limited thereto. The upper film 200 is first disposed and thermally sealed and the lower film 300 may be then disposed and thermally sealed.

As described above, the polymer-based pulsating heat pipe according to the present invention may be applicable to the flexible electronic device because it has high flexibility, and may efficiently cool the flexible electronic device because it has higher heat performance than copper (Cu).

In addition, by surrounding the channel by the multilayer film including the first blocking layer and coating the bonding part with the second blocking layer in order to prevent the air from penetrating through the bonding part between the upper and lower films, the inner portion of the channel may be maintained in the vacuum state and the heat performance of the polymer-based pulsating heat pipe may be maintained.

What is claimed is:

1. A polymer-based pulsating heat pipe comprising:
a base part having a flat plate shape in which a plurality of channels are formed, wherein the channels form a closed-loop in which both ends thereof are bent and connected to each other;
an upper film bonded to an upper portion of the base part; and
a lower film bonded to a lower portion of the base part and sealing the channels together with the upper film,
wherein the base part is formed of a polymer material,
wherein the upper film is formed in multilayers, wherein the multilayers comprise at least a lowest layer and a first upper blocking layer formed of a metal on an upper portion of the lowest layer, and
wherein the lower film is formed in multilayers comprising at least an uppermost layer and a first lower blocking layer formed of a metal on a lower portion of the uppermost layer.

2. The polymer-based pulsating heat pipe of claim 1, wherein at least one of the lowest layer of the upper film and the uppermost layer of the lower film which are bonded to the base part is formed of the same material as that of the base part.

3. The polymer-based pulsating heat pipe of claim 1, wherein the base part is formed of low-density polyethylene (LDPE), and
the lowest layer of the upper film and the uppermost layer of the lower film are formed of linear low-density polyethylene (LLDPE).

4. The polymer-based pulsating heat pipe of claim 1, wherein one side of the upper film and one side of the lower film are in contact with each other along a circumference of the base part to surround the base part, and
an outer portion of a bonding part at which one side of the upper film and one side of the lower film are in contact with each other is covered with a second blocking layer.

5. The polymer-based pulsating heat pipe of claim 4, wherein one side of the lowest layer of the upper film and one side of the uppermost layer of the lower film are in contact with each other to form the bonding part, and
the bonding part is covered with the second blocking layer so that the lowest layer of the upper film and the uppermost layer of the lower film of the bonding part are not exposed to the outside.

6. The polymer-based pulsating heat pipe of claim 4, wherein an outer side of the second blocking layer is covered with a protective layer.

7. The polymer-based pulsating heat pipe of claim 1, further comprising an inner portion blocking layer formed on inner surfaces of the base part forming the channels, the upper film, and the lower film.

8. The polymer-based pulsating heat pipe of claim 7, wherein the inner portion blocking layer is formed to vapor deposition or atomic layer deposition (ALD).

9. A manufacturing method of a polymer-based pulsating heat pipe according to claim 1, the manufacturing method comprising:
(a) forming a plurality of channels in which both ends thereof are bent and connected to each other to form a closed loop in a base part of a flat plate shape; and
(b) each bonding an upper film and a lower film to an upper portion and a lower portion of the base part by each disposing the upper film and the lower film on the upper portion and the lower portion of the base part and then applying heat and pressure in a direction of the base part from each of the upper film and the lower film,
wherein the base part is formed of a soft material,
the upper film includes a first upper blocking layer for preventing gas penetration to maintain a vacuum state, and
the lower film includes a first lower blocking layer for preventing the gas penetration to maintain the vacuum state.

10. The manufacturing method of claim 9, wherein the base part, and the lowest layer of the upper film and the uppermost layer of the lower film which are bonded to the base part are formed of a polymer material, and
in the operation (b), a sealing is performed between the base part and the lowest layer of the upper film and between the base part and the uppermost layer of the lower film by a heat sealing.

11. The manufacturing method of claim 9, further comprising:
(c) disposing one side of the lowest layer of the upper film and one side of the uppermost layer of the lower film to be in contact with each other according to a circumference of the base part in order to surround the base part;

(d) forming a bonding part by applying heat and pressure to the bonding part at which one side of the lowest layer of the upper film and one side of the uppermost layer of the lower film are in contact with each other; and (e) covering an outer portion of the bonding part with a second blocking layer so that the lowest layer of the upper film and the uppermost layer of the lower film of the bonding part are not exposed to the outside.

12. The manufacturing method of claim 11, further comprising (f) covering an outer side of the second blocking layer with a protective layer.

13. The manufacturing method of claim 9, wherein the operation (b) includes:
(b-1) disposing one of the upper film and the lower film on the base part and thermally sealing the base part and the disposed film to each other,
(b-2) disposing a screen on a side on which the film is not disposed among the upper portion and the lower portion of the base part,
(b-3) forming an inner portion blocking layer on a side surface of the base part forming the channels and an inner surface of the film disposed in the operation (b-1), and
(b-4) removing the screen, disposing the film that has the inner portion blocking layer formed on the inner surface thereof and is not disposed in the operation (b-1) in the base part, and then thermally sealing the base part and the film to each other.

14. The manufacturing method of claim 13, wherein in the operation (b-3), the inner portion blocking layer is formed using vapor deposition or atomic layer deposition (ALD).

15. The polymer-based pulsating heat pipe of claim 1, wherein the upper film is disposed on the upper portion of the base part and is bonded to the base part by applying heat and pressure in a direction of the base part.

* * * * *